United States Patent [19]

Calviello

[11] Patent Number: 4,692,997
[45] Date of Patent: Sep. 15, 1987

[54] METHOD FOR FABRICATING MOMOM TUNNEL EMISSION TRANSISTOR

[75] Inventor: Joseph A. Calviello, Kings Park, N.Y.

[73] Assignee: Eaton Corporation, Cleveland, Ohio

[21] Appl. No.: 863,773

[22] Filed: May 15, 1986

Related U.S. Application Data

[62] Division of Ser. No. 683,705, Dec. 19, 1984, Pat. No. 4,630,081.

[51] Int. Cl.$^4$ ............................................. H01L 21/02
[52] U.S. Cl. ........................... 437/238; 148/DIG. 43; 437/245
[58] Field of Search ................ 29/576 J, 580; 148/1.5, 148/DIG. 43; 357/4, 6, 56

[56] References Cited

U.S. PATENT DOCUMENTS

| | | | |
|---|---|---|---|
| 3,155,886 | 11/1964 | Pankove | 357/6 |
| 3,331,998 | 7/1967 | Zuleeg | 357/6 |
| 3,366,519 | 1/1968 | Pritchard, Jr. | 357/6 |
| 3,397,446 | 8/1968 | Sharp | 29/570 |
| 3,493,767 | 2/1970 | Cohen | 357/6 |
| 3,500,142 | 3/1970 | Kahng | 357/6 |
| 4,549,194 | 10/1985 | Calviello | 357/4 |
| 4,633,278 | 12/1986 | Lade et al. | 357/4 |

FOREIGN PATENT DOCUMENTS 1004396  6/1963  United Kingdom ................... 357/6

OTHER PUBLICATIONS

Ghandhi, "ULSI Fabrication Principles", John Wiley & Sons, N.Y., 83, p. 570.

*Primary Examiner*—Brian E. Hearn
*Assistant Examiner*—Tom Thomas
*Attorney, Agent, or Firm*—Andrus, Sceales, Starke & Sawall

[57] ABSTRACT

An MOMOM semiconductor device (72) has a plurality of mesa stacked horizontal layers including at least one metal layer (75) having an exposed edge at a generally vertical side (86) of the mesa. An oxide layer (76) is formed on the exposed edge of the metal layer. A second metal layer (77) extends along the side of the mesa over the first oxide layer. A second oxide layer (78) is formed on the second metal layer, and a third metal layer (79) is formed on the second oxide layer. An MOMOM tunnel emission transistor is provided by emitter metal (75) - oxide (76) - base metal (77) - oxide (78) - collector metal (79).

2 Claims, 20 Drawing Figures

MIM DIODE
2-BAND MODEL $V_g = 4.5 \, eV$ $V_{b1} = V_{b2} = 1.0 \, eV$ $S = 10 \, Å$

MIM DIODE
2-BAND MODEL $V_g = 4.5 \, eV$ $V_{b1} = V_{b2} = 1.0 \, eV$ $S = 20 \, Å$

MIM DIODE
2-BAND MODEL
$V_g = 4.5\,eV$
$V_{b1} = V_{b2} = 1.0\,eV$
$s = 30\,\text{Å}$

—— $T = 0°\,K$
— — $T = 473°\,K$
- - - $T = 673°\,K$

MIM JUNCTION
2-BAND INSULATOR
THEORY
$V_g = 4.5\,V$
$V_{b1} = 1.0\,eV$
$V_{b2} - V_{b1} = 1.0\,eV$

—— REVERSE
- - - FORWARD

MIM JUNCTION
2-BAND INSULATOR
THEORY
$V_g = 4.5V$
$V_{b1} = 0.5 eV$
$V_{b2} - V_{b1} = 1.0 eV$

—— REVERSE
--- FORWARD

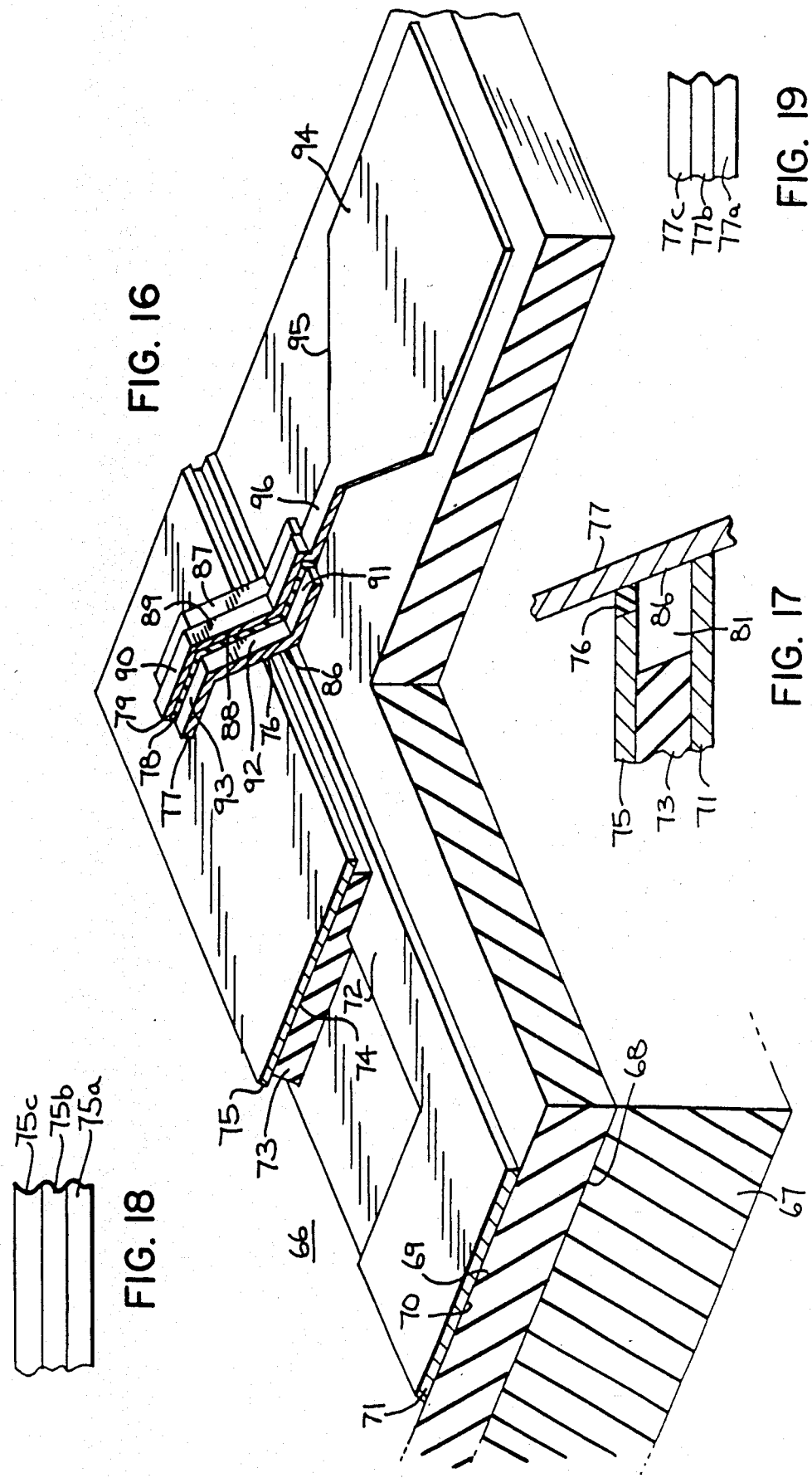

METHOD FOR FABRICATING MOMOM TUNNEL EMISSION TRANSISTOR

This is a divisional of application Ser. No. 06/683,705, filed Dec. 19, 1984, now U.S. Pat No. 4,630,081.

BACKGROUND

The invention relates to tunnel emission transistors, particularly for operation at submillimeter and optical wave frequencies.

Characteristics required for high performance tunnel emission transistors operating in the submillimeter and infrared wave frequencies include the fabrication of metal-oxide-metal tunnel diode junctions having pinhole-free high quality oxide, minimal parasitic shunt capacitance, minimal series inductance, minimal series resistance, minimal thermal resistance, minimal junction area and minimal junction barrier potential. In addition, these tunneling junctions must provide stable characteristics, and the structural configuration should be suitable for use in monolithic integrated circuits and arrays.

A tunnel emission transistor can be fabricated as an MOMOM device comprising $metal_1$-$oxide_1$-$metal_2$-$oxide_2$-$metal_3$. In the MOMOM configuration, $metal_1$ is the emitter, $metal_2$ is the base, and $metal_3$ is the collector, while $oxide_1$ is the emitter to base junction, and $oxide_2$ is the base to collector junction.

The design and fabrication of MOMOM tunnel emission transistors involves inherent difficulties and fundamental limits associated with the basic MOM junction. While some structures have been successfully fabricated and used as detectors and mixers at frequencies ranging from submillimeter to infrared frequencies with reasonably good performance, such structures have fundamental drawbacks limiting their practical usage in real world non-laboratory environments, and hence have not been commercially successful.

FIG. 1 shows a whisker-type MOM junction device 2 having a metal substrate 3, a dielectric oxide layer 4 on the substrate, and a metal whisker 5 making point contact 6 with oxide 4. The major disadvantage of a whisker-type structure such as 2 is the instability of the junction 6 due to thermal and pressure effects, rendering such structure a laboratory curiosity, not a practical device. Furthermore, even if the stability problem could be overcome, such structure would have limited use because of its incompatability with present advanced system design integrated circuits and arrays.

To overcome the problems inherent in point contact devices, attempts have been made to fabricate MOM tunnel diode devices in planar structures. FIG. 2 shows a side cross sectional view of such a device 7 comprising metal 8, oxide 9 and metal 10 positioned essentially in planar layers one above the other. FIG. 3 is a side cross sectional view of a device 11 comprising metal 12, masking oxide 13, junction oxide 14 and metal 15. FIG. 4 is a top plan view of the structure of FIG. 3 showing the circular configuration of the junction at 16. The devices in FIGS. 2-4 attempt to produce the equivalent of a point contact device such as 2 but using planar technology, even though the small dimensions of the point contact junction 6 cannot be achieved in the designs of FIGS. 2-4. The designs of FIGS. 2-4 further suffer high series resistance, high parasitic shunt capacitance, large junction areas on the order of $10^{-7} cm^2$ to $10^{-8} cm^2$, and undesirably high skin resistance. Operating efficiency is severely limited at frequencies on the order of 1,000 gigahertz.

There are additional processing related problems which prevent achieving a satisfactory planar device. Planar technology prevents defining an extremely small junction area or producing a metal layer with a high quality uniform thickness free of impurities and pinholes or a metal surface that is extremely smooth and without defects. Processing techniques generally use either a wet chemical etch or a pure sputtering etch. Both of these techniques lead to the formation of poor surface morphology which is not conducive to obtaining a thin uniform oxide necessary for the fabrication of high performance devices. Conventional optical lithography combined with either of the above etching processes cannot define the required small junction area in the $10^{-8}$ to $10^{-10} cm^2$ range. Even if it were possible to define a linewidth of 1 micron, it would still be difficult to fabricate the desired junction area reliably using the above noted processing techniques. In order to realize a 1 micron linewidth, the thickness of the metal would have to be limited to about 1,000 angstroms, thus increasing the resistivity of the leads to an unacceptably high value.

The ability to produce a very small junction area in a planar diode structure, FIGS. 2-4, is restricted by the dielectric layers such as 13. Layer 13 must be very thin in order to photolithographically define the junction. If the dielectric layer is too thick, the junction would not be well defined because the etching may not proceed uniformly through the thick dielectric layer. Since the dielectric layer 13 has to be thin, the region where metals 12 and 15 overlap will contribute an excessive amount of parasitic shunt capacitance. This capacitance will increase the diode's RC time constant, and thus lower the useful operating range of the diode to frequencies well below 1,000 gigahertz.

Another difficulty inherent in prior MOM junctions is that the required very thin oxide is derived from pure elements, for example tungsten, aluminum, etc., that result in the formation of the respective oxides such as $WO_3$, $Al_2O_3$, etc., having high dielectric constants and high losses. Using these dielectrics results in high junction capacitance. Furthermore, the thickness and purity of such dielectrics is not accurately controllable or repeatable because of the thermal, air ambient, or chemical exposure type oxidation techniques.

FIG. 5 shows a prior whisker-type tunnel emission transistor 17 having co-linear tungsten electrodes 18 and 19 oxidized at their tips 20 and 21 and separated by a gold layer 22, thus forming metal 18 - oxide 20 - metal 22 - oxide 21 - metal 19.

FIG. 6, and the sectional view in FIG. 7, shows another prior tunnel emission transistor 23 having first and second sets 24 and 25 of a plurality of finger-like aluminum electrodes separated by oxide layers 26 and 27 and metal base film 28, thus forming metal 24 - oxide 26 - metal 28 - oxide 27 - metal 25.

THEORY

Theoretical Estimate of Thermal Effect and Degree of Asymmetry in MOM Junctions An understanding of the properties of MOM tunnel diode junctions is necessary in order to establish design parameters needed for the fabrication of high performance symmetrical and asymmetrical junctions operating in the field assisted mode and with negligible thermal component. The following study concentrates on tantalum and $Ta_2O_5$, though it is applicable to other metallurgy including molybdenum, molybdenum/silicon, tungsten, tungsten/silicon, etc.

The voltage-current characteristics are calculated for symmetrical and asymmetrical junctions as a function of oxide thickness and barrier potential. These show that the fabrication of high performance tunnel effect transistors requires oxides in the 10 angstrom range in the emitter region and near 20 to 30 angstroms in the collector region as compared to much thicker oxide used in prior tunnel effect transistors.

Sommerfeld and Bethe, Hand Buch der Physik, van Geiger and Scheel, Julius Springer - verlog, Berlin, 1933, Vol. 24/2, p. 450, made a theoretical study of tunneling effect. It was shown that if two metal electrodes are separated by a very thin insulating film, current can flow between the two metal electrodes via tunneling. Simmons, Journal of Applied Physics, Vol. 34. No. 6, June, 1963, p. 1793, extended Sommerfeld's theory to include image forces and derived a generalized formula for the electric tunnel effect between electrodes forming a symmetrical junction and between dissimilar electrodes forming an asymmetrical junction.

A rigorous analysis of the MOM tunnel diode requires an exact solution of Schroedinger's wave equation in one dimension for a variable potential field. To simplify analysis, the following assumptions are typically followed in theoretical analysis: WKB Wentzel-Krammers-Brillouin, approximation is valid; and metal electrodes can be treated as free electrons in a box, thus ignoring their detailed energy band structure; and a parabolic energy band exists in the insulator. Simmons calculated the current-voltage, I-V, characteristic of an MOM junction using a one band model and the effective mass approximation. This approximation becomes somewhat inaccurate whenever carriers at energy levels near the center of the insulator band gap contribute to the junction current.

In the one band model, the energy band structure of the insulator is represented by a conduction band and a valence band separated by an infinite band gap, hence a one band model. As long as the band gap in the insulator is much greater than the surface barrier voltage, the use of a one band model is sufficient.

For an insulator such as $Ta_2O_5$ with a band gap near 4 to 4.5 electron volts, the use of a two band model will give better results when the barrier voltages are about 2 electron volts or greater. In addition, the two band model renders more accurate analysis and predicts the I-V characteristics of asymmetrical junctions as well as their behavior as a function of temperature. In the two band model, the presence of the valence band affects tunneling in two ways: it affords a parallel path for the current to flow via hole conduction; and it results in reduced wave attenuation in the potential barriers.

Using the two band model, the I-V characteristics are calculated for a symmetrical Ta-$Ta_2O_5$-Ta MOM tunnel diode as a function of temperature and the results are plotted in FIGS. 8-10. In FIG. 8, ordinate 29 represents current density in amperes per square centimeter, and abscissa 30 represents voltage in volts. First plot 31 in solid line represents the I-V characteristic at a temperature of 0° K. Second plot 32 in long dashed line represents the I-V characteristic at 473° K. Third plot 33 in short dashed line represents the I-V characteristic at 673° K. The band gap $V_g$ is 4.5 electron volts. Each barrier potential $Vb_1$ and $Vb_2$ is 1.0 electron volt. The oxide thickness S is 10 angstroms. FIG. 9 shows a similar graph with plots 34-36, and the same parameters except that the insulator thickness S is increased to 20 angstroms. FIG. 10 shows another similar graph with plots 37-39, and the same parameters except that the insulator thickness S is increased to 30 angstroms.

FIGS. 8-10 show that tunneling theory predicts that the I-V characteristics are temperature dependent, and that the dependence on temperature decreases as the oxide insulator thickness decreases to about 10 angstroms or thinner. Thus, for an MOM tunnel diode with an oxide thickness in the 5 to 10 angstrom range, the I-V characteristic should be almost temperature independent.

Using the above theory, the I-V characteristic of an asymmetrical Ta-$Ta_2O_5$-Ta MOM tunnel diode as a function of oxide insulator thickness is also calculated for two values of the first metal barrier potential $Vb_1=1.0$ electron volt, FIG. 11, and $Vb_2=0.5$ electron volt, FIG. 12, where $Vb_2-Vb_1=1$ electron volt, where $Vb_1$ and $Vb_2$ are the barrier potentials at the first and second metal oxide interfaces respectively. The result is shown in FIGS. 11 and 12.

In FIG. 11, ordinate 40 represents current density in amperes per square centimeter, and abscissa 41 represents the junction voltage in volts. Solid plots 42-45 represent the I-V characteristic at a reverse voltage for various oxide insultator thicknesses. Dashed plots 46-49 represent the I-V characteristic at a forward voltage for the various oxide insulator thicknesses. The oxide thicknesses range from 40 angstroms down to 10 angstroms in 10 angstrom steps for respective plots 42-45 and 46-49. The same format is followed in FIG. 12 for respective reverse voltage plots 50-53 and forward voltage plots 54-57. FIGS. 11 and 12 show that the magnitude of the asymmetry in the I-V characteristic is a function of oxide insulator thickness and barrier potential.

The structural configuration of the tunnel diode shown in FIG. 13, disclosed in my U.S. Pat. No. 4,549,194. issued Oct. 22, 1985, was designed and fabricated using the results of the above analysis. A substrate 58 has an insulating layer 59 and a metal layer 60. Peninsula-like projection 61 of metal layer 60 is oxidized at its tip 62. A second metal layer 63 contacts tip 62 and is covered by a lead 64. The MOM tunnel diode is formed by metal 60 - oxide 62 - metal 63. The same type of structure may be provided at second lead 65.

The successful development of structure such as that in FIG. 13 requires the MOM tunnel diode junction to preferably have the following characteristics: an oxide thickness in the 5 to 15 angstrom range for symmetrical structures, and greater than 15 angstroms for asymmetrical junctions; low barrier potential less than 1 electron volt; junction area ranging between $10^{-10}$ to $10^{-11} cm^2$; negligible shunt capacitance, less than $10^{-17}$ farad, a diode that is structurally stable and almost invariant to local oscillator pump power; negligible dependence on temperature; negligible skin effect resistance contribution; junction fully exposed to input radiation, for example the absence of dielectric covering the junction for the purpose of either passivation or any other reason such as structural configuration, which dielectric may otherwise absorb at the operating frequency. Such a structure has been successfully fabricated and has achieved heterodyne detection at 10.6 micron wavelength, at barrier potential of 0.4 to 0.5 electron volt.

In the MOM tunnel diode structure of FIG. 13, the required characteristics for an MOM tunnel diode junction operating at infrared frequencies, which include negligible parasitic shunt capacitance of $10^{-5}$ pf or less, a submicron junction area of $10^{-10}$ cm$^2$ and very low series resistance, are achieved by means of a structural configuration and geometry which permits the definition of submicron linewidths. The structure utilizes planar technology, however an extremely small peripheral junction is formed, rather than the usual large planar junction. In addition, the leads are formed in a semi-arch configuration to function as a monopole antenna element suspended in air, enhancing the coupling efficiency to the device. Lead resistance normally incurred in the metal layer is reduced by providing a relatively thick overlayer of gold which may range from 1,000 angstroms to 5,000 angstroms.

In the processing technique for the structure and geometry of FIG. 13, reactive plasma etching is used to define the linewidths and also to etch the surface of the junction prior to the formation of the oxide layer. A peninsula-like projection used to form the submicron peripheral junction is defined by reactive plasma etching, resulting in a clean smooth peripheral surface edge, an essential preparatory step in achieving a uniformly thin and pinhole-free metal oxide layer at the junction. The formation of such high quality oxide at the junction is important in the tunneling of carriers and is therefore significant in producing a reliable and high performance MOM tunnel diode.

Using the structure of FIG. 13 and the noted processing, excellent performance, reliability and repeatability has been achieved at infrared frequencies in the wavelength range of 8 to 12 microns, and has responded to optical frequencies via field assisted tunneling. It has been found that the measured direct detection signals in other planar structures are fully attributed to thermal effect, not direct detection via field assisted tunneling. The thermal assisted signals are predicted theoretically, as noted above.

The reasons for failure of prior MOM tunnel devices to perform satisfactorily in the heterodyne mixing or field assisted mode are: junction areas which are too large, and the low current density resulting therefrom; excessively high series resistance at optical frequency; lossy metallurgy, including high base resistance metallurgy; excessive thermal assisted tunneling which lowers tunneling probability for field assisted tunneling; poor oxide quality, including high dielectric constant, and losses in the oxide; junctions having high barrier potential near or above two electron volts; structural geometry contributing to large parasitics, including high parasitic shunt capacitance; and the use of symmetric junctions for the emitter-base and the base-collector which resulted in essentially similar impedance for the input and output and high leakage of electrons from base to collector as well as a low current transfer ratio of collector current to emitter current.

Tunnel Effect Transistor Performance

Assuming a one band model as shown in FIG. 14 where the band gap $E_g$ is not greater than the barrier potential $\Phi$ and the applied voltage is greater than $\Phi$, the current density J, not considering image forces, in an MOM junction is approximated by (A. G. Chynoweth, Progr. in Semiconductors 4, 97 (1959)):

$$J = J_o \left(\frac{E}{E_o}\right)^2 \exp\left(\frac{-E_o}{E}\right) \text{ where}$$

$$J_o = \frac{2q\Phi^2 m^*}{9\hbar\pi^2}$$

$$E_0 = \frac{4\Phi^{3/2}(2m^*)^{1/2}}{3\hbar q}$$

m = effective electron mass
q = electron charge
$\hbar = h/2\pi$
h = Planck's constant
$\Phi$ = metal-insulator work function A simplified band diagram of a tunnel effect transistor is shown in FIG. 15. An MOMOM device is formed by the emitter-oxide$_1$-base-oxide$_2$-collector. Electrons tunneling through the thin base region find themselves in the conduction band of the second oxide and, assuming the collector is positively biased, will be accelerated to the right and hence collected. Tunnel effect transistors can be characterized similarly to a conventional bipolar transistor in electrical schematics. In a common base connection, power gain can be obtained as a result of the impedance transformation between incremental input and output impedance.

Frequency Limitations

Since tunneling occurs within an extremely short time, the operating frequency is limited by the input capacitance and associated resistance. A figure of merit M can be defined as (C. A. Mead "Operation of Tunnel-Emission Devices" JAP 32 No. 4, 646 (1964)):

$$M = (1/RC)$$

where R is the incremental base input resistance defined by $$R = (1/dI/dV)$$

and the input capacitance C (Emitter base) is given by $$C = (eA/D)$$

where D is the oxide thickness, A is the junction area, and e is the oxide dielectric constant. Thus the figure of merit M, using the above relation is given by $$M = (JE_o/eE^2)$$

Using the MOM tunnel diode geometry of FIG. 13, it is possible to achieve current densities J in the range 4 to $6\times10^6$ Ampere/cm$^2$ range at field values in the 1.2 to $1.6\times10^7$ volts/cm range. The calculated figure of merit M approaches $10^{12}$ cycles per second. Thus, using a properly design MOM tunnel diode junction it is possible to realize a figure of merit needed to efficiently operate a tunnel effect transistor in the optical region. In addition, the simple theory indicates the need to fabricate devices having very small junction area in order to achieve the highest current density possible, and oxides having very low dielectric constant and free of impurities to achieve these high field values.

SUMMARY

It is an object of the present invention to provide a tunnel effect transistor which overcomes the fabrication and yield difficulties encountered with prior planar and whisker-type tunnel effect transistor devices.

It is a further object of the invention to provide a high performance reliable tunnel effect transistor operating in the submillimeter to optical wave frequency range, including preferred characteristics for efficient operation in such range, including negligible parasitic base resistance, low lead inductance and resistance, low shunt capacitance, small emitter junction area in the $10^{-10}$ cm$^2$ range or below, high purity oxides with refractive indices in the 1.55 to 1.7 range, low junction barrier potential below 1 electron volt at the emitter and 0.5 electron volt at the collector.

These are achieved by a combination of novel structural geometry and, in the preferred embodiment, advanced dry etch plasma processing, new metallurgy and the use of gallium arsenide very high doped N+ epitaxial layers with carrier concentration in the 1 to $4\times10^{19}$ cm$^{-3}$ range grown by molecular beam epitaxy.

The structure utilizes planar technology, and an extremely small and stable peripheral junction is formed, rather than the usual large planar junction or the unstable whisker-type junction.

Leads are formed in a semi-arch configuration, the length of which is dictated by the operating frequency, to function as monopole antenna elements for enhancing the coupling of incoming radiation to the device junction. Lead resistance, normally incurred in the second metal layer of prior planar devices, is reduced by providing a relatively thick overlayer of gold which may range from 1,000 to 5,000 angstroms in the preferred species.

The base metal contact resistance is drastically reduced and essentially eliminated by providing a low resistance gold metallurgical contact to the base metal via bridging techniques and within 1,000 angstroms from the emitter junction.

The barrier potential at the emitter base junction is below 1 electron volt and is achieved by using a refractory metal or refractory silicon alloy metallurgy such as tantalum, tantalum/silicon, molybdenum, molybdenum/silicon, tungsten or tungsten/silicon. The addition of silicon allows for the formation of high quality oxides having low loss and low dielectric constant.

The metallurgy for the emitter, base and collector in the MOMOM structure are chosen to give a respective barrier height satisfying the relation $V_c < V_e$, where $V_c$ is the base to collector voltage, and $V_e$ is the emitter to base voltage, and where the oxide is either native or reactively deposited using tantalum or tantalum/silicon metallurgy for forming the emitter oxide (0.7 electron volt $\leq V_e \leq$ 1 electron volt) and molybdenum or molybdenum/silicon to form the collector oxide (0.4 electron volt $\leq V_c \leq$ 0.6 electron volt). The percent of silicon can be varied (5–40%) to form oxide with desired quality.

A table of base metals having hot electron/electron, electron/phonon mean free path in excess of 400 angstroms for electron/electron and electron/phonon are selected as shown in Table I below, where MFP is the hot electron mean free path in angstroms

TABLE I

Hot Electron Mean Free Path (MFP) In Some Metals Near 1 eV Above Fermi Level

| Metals | Excess energy(ev) | MFP(A) |
|---|---|---|
| $P_d$ | 1 | e—e ≈ 650, e—ph ≈ 100 |
| Au | 1 | 700 (average) |
|  |  | e—e ≈ 1200, e—ph ≈ 400 |
| Ag | 1 | e—e, e—ph ≈ 570 |
|  | 1.1 | 450 | e-e is electron-electron collision, and e-ph is electron-phonon collision. In addition, design parameters for tunnel effect transistor devices which include oxide thicknesses and barrier potential for the emitter-base and base-collector junction are shown in Table II below.

TABLE II

Desirable Design Parameters For Optical Transistors

| Oxide Thickness (A°) | Barrier potential (ev) |
|---|---|
| Emitter/Base $d_{EB} \times 15$ | $0.7 \leq \Phi_E \leq 1.0$ |
| Base/Collector $20 \leq d_{BC} \leq 30$ | $.5 \leq \Phi_c \leq 0.7$ |

$d_{EB}$ is the oxide thickness between emitter and base. $d_{BC}$ is the oxide thickness between base and collector. $\Phi_E$ is the barrier potential potential of the emitter. $\Phi_c$ is the barrier potential of the collector.

In the preferred processing techniques, reactive plasma etching is used to define micron and submicron linewidth and spacing, and also to etch the surfaces to be oxidized prior to the formation of the oxide layers. A submicron peripheral junction is defined by the reactive plasma etching, resulting in a clean smooth peripheral surface edge, a significant preparatory step in achieving a uniformly thin and pinhole-free oxide layer to the junction. A high quality oxide at the junction is formed by reactive deposition or etching and is a significant parameter directly affecting tunneling of carriers, and is thus significant in producing a reliable and high performance tunnel effect transistor. In addition, the cleaning, oxidation and metallization are performed in situ in an extremely clean and high vacuum sputtering system. The smooth and clean etched surface achieved by reactive ion etching is also important for the formation of a low resistance and pinhole-free base metal layer whose thickness will be in the 100 to 300 angstrom range.

The structural design and geometry of the present invention enables the above noted features and advantages in a particularly simple and effective manner.

BRIEF DESCRIPTION OF THE DRAWINGS

FIG. 16 is a schematic perspective view of MOMOM structural geometry in accordance with the invention.

FIG. 17 is a sectional view of a portion of FIG. 16.

FIG. 18 is a sectional view of another portion of FIG. 16.

FIG. 19 is a sectional view of another portion of FIG. 16.

DETAILED DESCRIPTION

Figure 1:
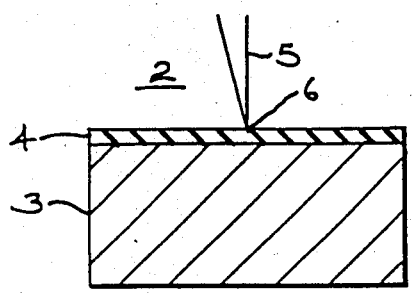
FIG. 1 is a schematic illustration of a prior art point contact tunnel diode.
Figure 2:
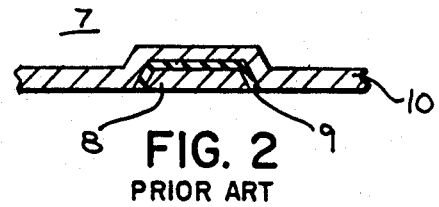
FIG. 2 is a schematic cross sectional view of a prior art planar tunnel diode.
Figure 3:
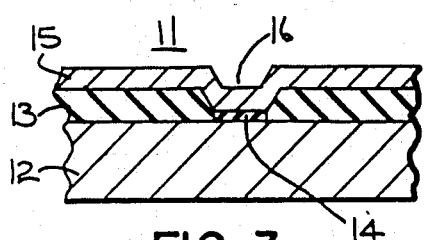
FIG. 3 is a schematic cross sectional view of another prior art planar tunnel diode having a circular junction configuration.
Figure 4:
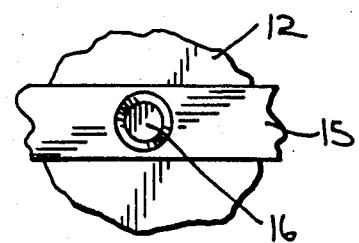
FIG. 4 is a schematic top plan view of the device of FIG. 3.
Figure 5:
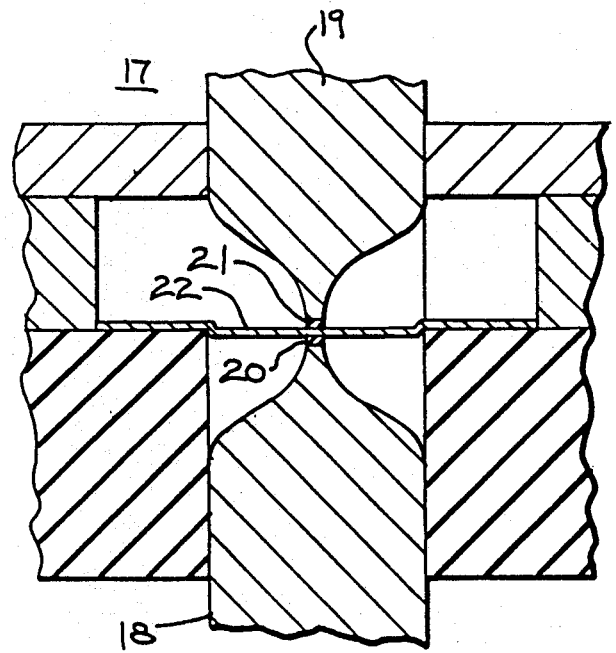
FIG. 5 is a schematic cross sectional view of a whisker-type prior art MOMOM tunnel effect transistor.
Figure 6:
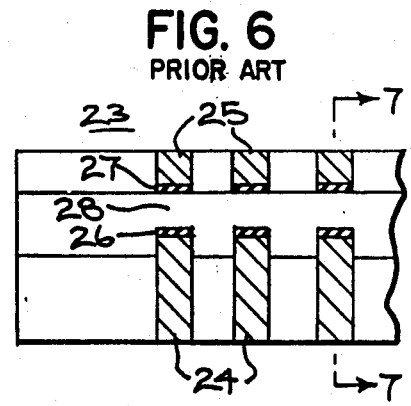
FIG. 6 is a cross sectional schematic view of a planar multifinger prior art MOMOM tunnel effect transistor.
Figure 7:
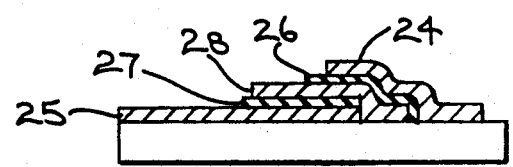
FIG. 7 is a sectional view taken along line 7—7 of FIG. 6.
Figure 8:
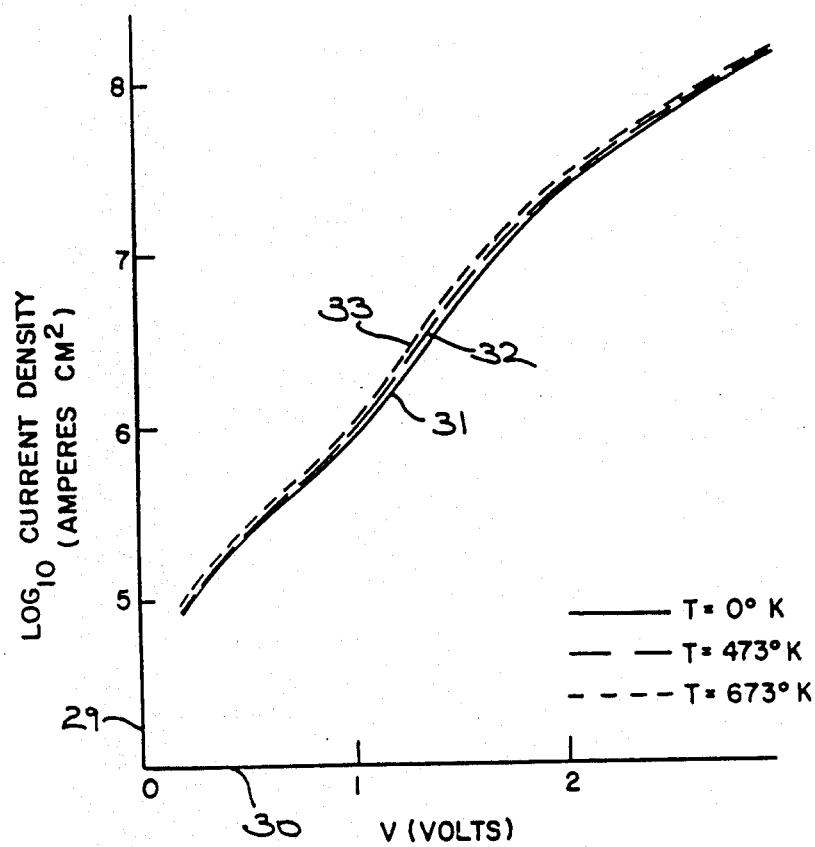
FIG. 8 is a graph showing the current-voltage characteristic of a symmetrical tunnel diode with oxide thickness of 10 angstroms.
Figure 9:
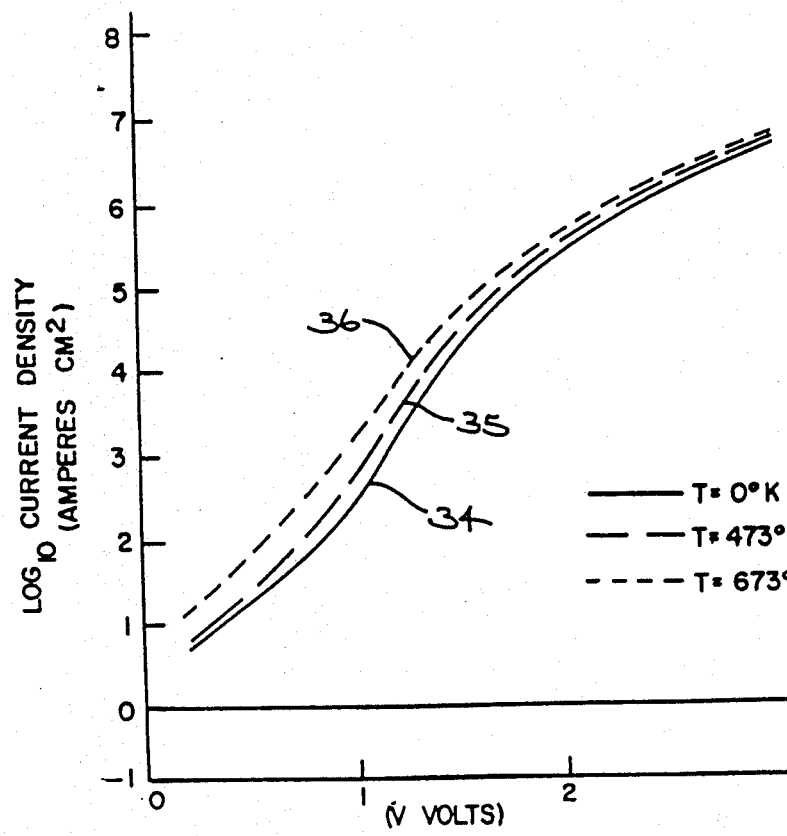
FIG. 9 is a graph showing the current-voltage characteristic of a symmetrical tunnel diode with oxide thickness of 20 angstroms.
Figure 10:
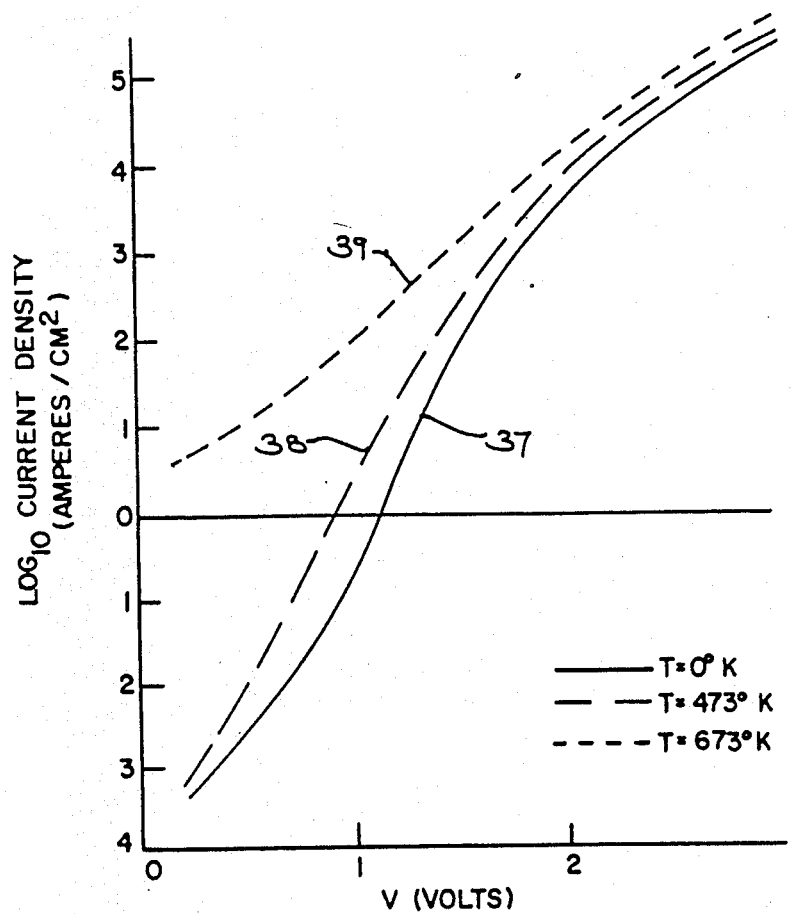
FIG. 10 is a graph showing the current-voltage characteristic of a symmetrical tunnel diode with oxide thickness of 30 angstroms.
Figure 11:
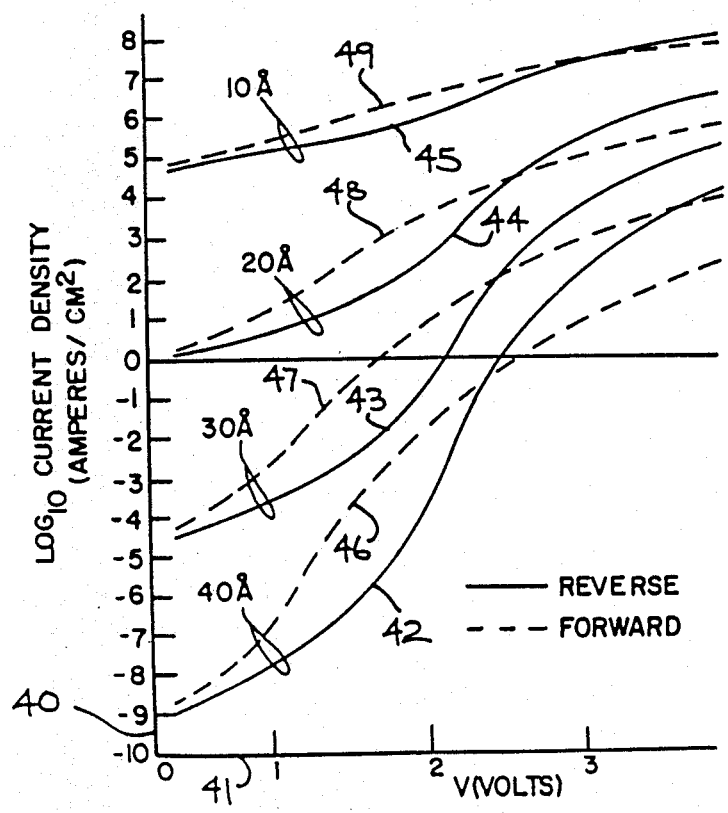
FIG. 11 is graph showing the current-voltage characteristic of an asymmetrical tunnel diode with a barrier potential of 1.0 electron volt.
Figure 12:
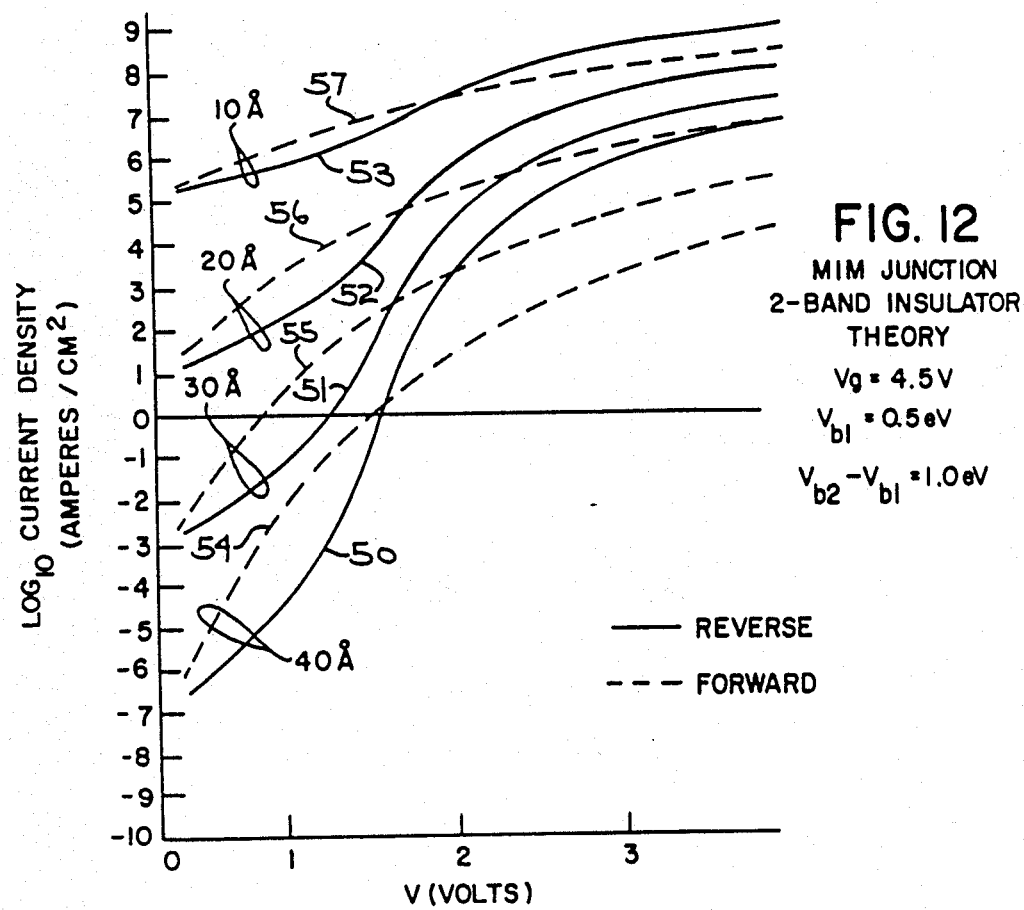
FIG. 12 is a graph showing the current-voltage characteristic of an asymmetrical tunnel diode with a barrier potential of 0.5 electron volt.
Figure 13:
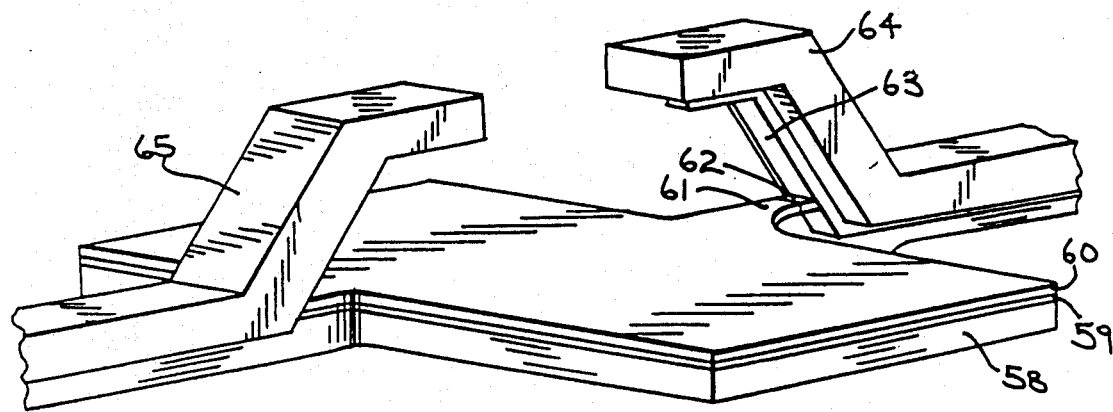
FIG. 13 is a schematic perspective view of my MOM tunnel diode structure in my noted U.S. Pat. No. 4,549,194, issued Oct. 22, 1985.

As noted above in detail, the reasons for prior tunnel effect transistors failing to perform satisfactorily as optical amplifiers include: too large a junction area; excessively high series resistance (lead and base resistance) at DC and most notably at submillimeter and optical wave frequency (skin effect); junction designs and fabrications resulting in large thermal contribution, and consequently in a reduction of the tunneling probability for field emission generation; poor oxide quality; improper barrier potential and oxide thickness for the emitter and collector; and high parasitic shunt capacitance and series lead inductance.

FIG. 16 shows an MOMOM tunnel effect transistor structure overcoming the above noted and other problems Tunnel effect transistor 66 in FIG. 16 includes a substrate 67 of electrically insulating material, such as dielectric material (e.g. quartz or the like) or semi-insulating semiconductor material (e.g. silicon, gallium arsenide, etc. doped to a semi-insulating condition). On the upper planar horizontal surface 68 of insulator substrate 67 there is formed a first insulator layer 69 such as silicon dioxide, semi-insulating gallium arsenide, silicon nitride, calcium fluoride, aluminum oxide, and the like, ranging in thickness from 1,000 to 5,000 angstroms. On the upper planar horizontal surface 70 of insulator layer 69 there is formed a first metal layer 71 such as gold ranging in thickness from 100 to 1,000 angstroms. On the upper planar horizontal surface 72 of layer 71 is a second insulator layer 73 such as silicon dioxide or another insulator, ranging in thickness from 1,000 to 10,000 angstroms. On the upper planar horizontal surface 74 of layer 73 is a second metal layer 75 ranging in thickness from 50 to 500 angstroms. The noted layers are stacked in a mesa structure. A junction oxide layer 76 is formed at the edge of metal layer 75, FIGS. 16 and 17, and ranges in thickness from 5 to 20 angstroms. Metal layer 77 provides the base of the transistor and is in the form of a semi-arch. Junction oxide layer 78 (10-40 angstroms) is on metal layer 77, and metal layer 79 is on oxide layer 78. The MOMOM tunnel emission transistor is formed by metal 75 - oxide 76 - metal 77 - oxide 78 - metal 79.

Figures 14, 15, 20:
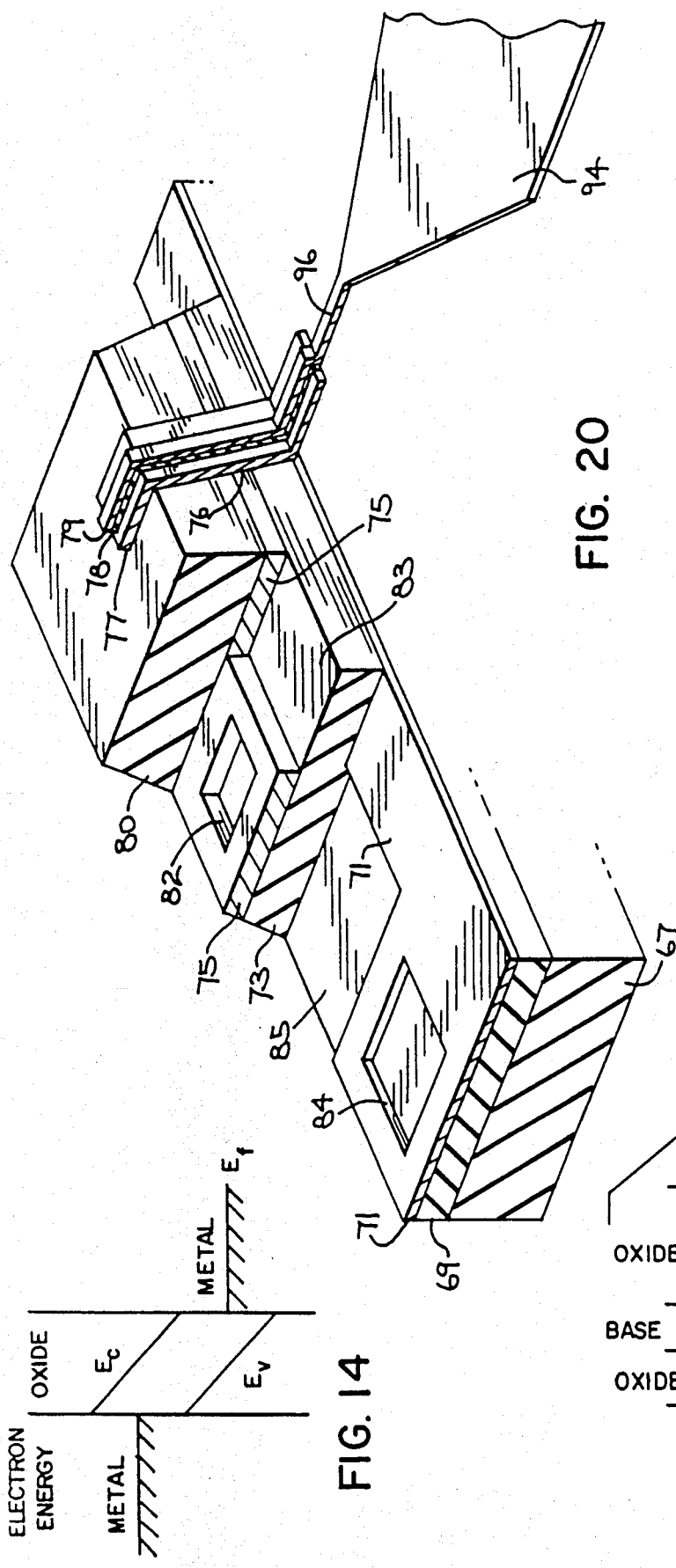
FIG. 14 is a simplified energy band diagram of an MOM tunnel diode.
FIG. 15 is a simplified energy band diagram of an MOMOM tunnel emission transistor.
FIG. 20 is a schematic perspective view of a tunnel effect transistor wherein the base and emitter can be designed to minimize interelectrode or interlayer parasitic coupling capacitance.

Upper surface 68 of substrate 67 is covered by sequential and in situ deposition of first insulator layer 69 and first metal layer 71. Portions of layer 71 are removed to achieve a desired shape. Second insulator layer 73, metal layer 75 and a third insulator or photoresist layer 80, FIG. 20, are then sequentially deposited. Using reactive plasma dry etching for example with $CF_4$ or $Ar/O_2$, a mesa is etched to expose the edges of metal layer 71 and metal layer 75 along a generally vertical side of the mesa, such as the 111 plane. Following the mesa definition, in situ reactive plasma oxidation of oxidizable emitter metal 75 is performed to yield oxidized edge 76, followed by deposition of base metal 77 and definition of same. At this stage, base metal 77 makes metallurgical and low resistivity electrical contact to metal layer 71, and forms a tunneling junction to emitter metal layer 75 across junction oxide 76. The lateral width of semi-arch metal 77 can easily be defined in the 0.5 to 1 micron range.

Following sputter cleaning of the surface of base metal 77, in situ oxide layer 78 formation is achieved by reactive deposition or oxidation of the base metal surface, followed by deposition of metal layer 79. Using reactive plasma processes, layer 79, such as gold, is sputter etched in an argon/oxygen plasma and the collector 79 linewidth can easily be near or below 0.5 microns. The fabrication of the structure in FIG. 16 is completed by removing the third dielectric layer 80, FIG. 20, and by using a buffered HF solution form and undercut an air bridge 81, FIG. 17.

The silicon dioxide undercut and removal of dielectric layer 73 yielding air bridge 81 reduces parasitic capacitance, which in turn provides efficient operation in the submillimeter to optical region. The separation between metal layer 75 and metal layer 71 can be as low as 1,000 angstroms, thus reducing the base resistance to an insignificant low value.

To achieve high quality oxide, and to reduce optical absorption and skin effect resistance, the emitter metal 75 can be formed by a multi-layer metallurgy, FIG. 18, such as a thin layer 75b of gold (50 to 200 angstroms thick) sandwiched between two thin layers 75a and 75c of tantalum/silicon (50 to 150 angstroms thick), where the silicon content can vary between 5 and 30 percent. In this alloy, the gold serves to reduce the thin metal layer resistance, and the silicon in tantalum is used to derive junction oxide in the form of tantalum/silicon-/oxide with a dielectric constant in the 1.6 to 1.8 range, and a barrier potential in the 1 to 0.7 electron volt range.

The properties of base metal 77 are significant to successful operation of the tunnel effect transistor. The base metal may be composed of a compounded multi-layer metallurgy. As indicated in Table I, in gold, the hot electron mean free path for electron/electron and electron/phonon is 1,200 angstroms and 400 angstroms, respectively. Thus, for efficient tunneling of electrons through the base metal, the gold thickness should be below 400 angstroms. Using sputter deposition techniques and clean ambient conditions, it is possible to deposit a 100 angstrom thick layer of gold that is free of pinholes and defects. Molybdenum or molybdenum/silicon may alternatively be used for layer 77.

To achieve the desired barrier for the base and emitter, as well as low resistivity, the base metal 77 can alternatively be composed of a multi-layer metallurgy, FIG. 19, including a thin first layer 77a of either molybdenum, molybdenum/silicon, tantalum or tantalum/silicon (less than 50 angstroms), to improve gold adherence to the emitter oxide and to the mesa edge, a central layer 77b of gold (100 to 250 angstroms), and a top layer 77c of molybdenum, molybdenum/silicon (10 to 100% silicon), tantalum or tantalum/silicon (10 to 100% silicon). Top layer 77c may be used to reactively form the base to collector junction made of oxide, or it can be totally eliminated and instead the base to collector oxide be formed by direct reactive plasma deposition of an oxide layer derived from a molybdenum/silicon sputtering target in an oxidizing ambient condition. The addition of silicon contributes to the formation of very high quality oxide, and achieves junction barrier potential in the 0.4 to 0.5 electron volt range for molybdenum/silicon and 0.6 to 1 electron volt for tantalum/silicon. These junctions have resulted in detectors having excellent responsivity at 10.6 micron wavelength.

The structural geometry of FIG. 16 provides satisfactory design objectives including extremely small junction area at the emitter ($\leq 10^{-10}$ cm$^2$) and high current densities. The parasitic capacitance, inductance and resistance, have been drastically reduced, thus leading to a very high figure of merit that is near or above $10^{12}$ cycles per second, and a new metallurgy adopted to achieve junction oxides having very low barrier potential as asymmetrical junctions between the emitter/base and base/collector for achieving desirable low input and high output impedance.

To reduce parasitic interelectrode or interlayer capacitance, the layers can be selectively configured via selective growth or implantation to provide minimum overlap, for example as shown by cutouts 82-85, FIG. 20, in layers 75 and 71. The structural geometry of the invention enables the layers to be so defined.

In addition to the above described oxidation techniques which include the use of a sputtering etching mode in a plasma ambient containing 5 to 50% oxygen in argon gas and pure reactive deposition from molybdenum, molybdenum/silicon, tantalum, tantalum/silicon, tungsten, and tungsten/silicon, etc., in a pure oxygen plasma ambient, there is another method for forming very thin oxides using the Langmuir-Bladgett film deposition technique to form monomolecular polymer films. The technology of monomolecular film formation is of course well known, however it is now emerging as a promising technology to form highly controllable, very pure polymer films having controllable dielectric and electrical properties as described by G. G. Roberts, "Transducers and Other Applications of Langmuir Bladgett Films", *Sensors and Actuators* 4, 1983, pp. 131-145. These monomolecular films are deposited at room temperature and in a highly pure water bath solution and can provide oxide films having extremely sharp interfaces, controllable thicknesses, desirable electrical and optical properties, crystalline structures, and high field strength. Furthermore, since the characteristics of these monomolecular films can be easily varied by varying the composition of the polymer to achieve desirable electrical and optical properties, they are particularly suitable to the fabrication of tunnel effect transistor devices for the formation of the emitter and collector oxides having the desired barrier potentials.

The present invention provides an MOMOM semiconductor device 66 comprising a plurality of mesa stacked horizontal layers including at least one metal layer 75 having an exposed edge at a generally vertical side 86 of the mesa, a first generally vertical oxide layer 76 on the exposed edge of metal layer 75, a second metal layer 77 having a generally vertical portion 87 extending along the side of the mesa over oxide layer 76 a second oxide layer 78 having a generally vertical portion 88 on vertical portion 87 of metal layer 77, and a third metal layer 79 having a generally vertical portion 89 on second oxide layer 78. Metal layer 79 extends upwardly beyond first metal layer 75 and then over and spaced above layer 75 as shown at semi-arch configuration 90. Metal layer 77, being the base of the transistor, includes a lower generally horizontal portion 91 on the upper surface of dielectric layer 69 adjacent metal layer 71 and a generally vertical portion 92 extending upwardly along the side of the mesa beyond metal layer 75 to be spaced thereabove at upper generally horizontal portion 93 in semi-arch configuration. Metal layer 79 includes a lower horizontal widened contact pad portion 94 on dielectric layer 69 and transition section 95 to narrow section 96 proximate horizontal portion 91 of metal layer 77 and separated therefrom by oxide layer 78. In the preferred embodiment, metal layer 79 is the collector and metal layer 75 the emitter of the transistor, though their roles may be reversed. The invention enables at least two of metal layers 71, 75, 77 and 79 to be of different material, and the thickness of oxide layer 76 to be less than the thickness of oxide layer 78. The barrier potential of the junction between metal layers 75 and 77 across oxide layer 76 may thus be greater than the barrier potential of the junction between metal layers 77 and 79 across oxide layer 78.

It is recognized that various alternatives and modifications are possible within the scope of the appended claims. Specific parameters and data have been disclosed for particular structures and technologies and are believed accurate, however the invention is not limited thereby.

I claim:

1. A method for making an MOMOM tunnel emission transistor comprising the steps of:
   providing a substrate having a generally horizontal planar upper surface;
   forming a first insulator layer on said upper surface of said substrate;
   forming a first metal layer ranging in thickness from 100 to 1,000 angstroms on the upper surface of said first insulator layer;
   forming a second insulator layer ranging in thickness from 1,000 to 10,000 angstroms on the upper surface of said first metal layer;
   forming a second metal layer ranging in thickness from 50 to 500 angstroms on the upper surface of said second insulator layer;
   defining a mesa having generally vertical sides exposing the edges of said layers;
   oxidizing the exposed edge of said second metal layer to form a first oxide layer ranging in thickness from 5 to 20 angstroms;
   forming a third metal layer extending along a portion of the upper surface of said first insulator layer adjacent said first metal layer and also extending along said side of said mesa;

oxidizing said third metal layer to form a second oxide layer ranging in thickness from 10 to 40 angstroms;

forming a fourth metal layer extending along said second oxide layer and including a portion on said insulator layer proximate said third metal layer and separated therefrom by said second oxide layer, said second metal layer being one of the emitter and collector of said transistor, said fourth metal layer being the other of the emitter and collector of said transistor, said third metal layer being the base of said transistor.

2. The invention according to claim 1 comprising:

forming said third insulator layer on the upper surface of said second metal layer;

forming said third metal layer, said second oxide layer and said fourth metal layer extending along said side of said mesa and then along the upper surface of said third insulator layer to be spaced above said second metal layer in a semi-arch configuration;

forming said fourth metal layer having a widened section on said first insulator layer and a narrowed section on said second oxide layer and a transition section on said first insulator layer connecting said widened and narrowed sections.

* * * * *